(12) United States Patent
Schuler

(10) Patent No.: US 8,742,803 B2
(45) Date of Patent: Jun. 3, 2014

(54) OUTPUT DRIVER USING LOW VOLTAGE TRANSISTORS

(71) Applicant: Broadcom Corporation, Irvine, CA (US)

(72) Inventor: John Schuler, Gilbert, AZ (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 13/627,975

(22) Filed: Sep. 26, 2012

(65) Prior Publication Data

US 2014/0084962 A1    Mar. 27, 2014

(51) Int. Cl.
*H03B 1/00*    (2006.01)
*H03K 3/00*    (2006.01)

(52) U.S. Cl.
USPC ............ 327/112; 326/83; 327/309; 327/180

(58) Field of Classification Search
USPC ............... 327/108–112, 309, 427, 180, 333; 326/82, 83, 86
See application file for complete search history.

(56) References Cited

U.S. PATENT DOCUMENTS

| | | | | |
|---|---|---|---|---|
| 5,475,326 A | * | 12/1995 | Masuda | 327/157 |
| 5,475,329 A | * | 12/1995 | Jones et al. | 327/377 |
| 5,631,588 A | * | 5/1997 | Bertolini | 327/108 |
| 6,104,229 A | * | 8/2000 | Lien | 327/434 |
| 6,606,271 B2 | * | 8/2003 | Hunt | 365/189.05 |
| 6,958,631 B2 | * | 10/2005 | Aiba et al. | 327/112 |
| 7,016,258 B2 | * | 3/2006 | Lim | 365/189.14 |
| 7,088,151 B1 | * | 8/2006 | Dequina et al. | 327/108 |
| 7,969,206 B2 | * | 6/2011 | Ito | 327/108 |
| 8,410,827 B2 | * | 4/2013 | Yano | 327/108 |

* cited by examiner

*Primary Examiner* — Lincoln Donovan
*Assistant Examiner* — Thomas Skibinski
(74) *Attorney, Agent, or Firm* — McDermott Will & Emery LLP

(57) ABSTRACT

Aspects of the subject technology allow an output driver to be implemented using one or more transistors having an oxide-breakdown voltage below the output voltage swing of the output driver. The output driver can include one or more source followers, where a source follower provides voltage-level shifting of a voltage before the voltage is supplied to a gate of a transistor to prevent a source-to-gate voltage or a gate-to-source voltage of the transistor from exceeding the oxide-breakdown voltage of the transistor.

23 Claims, 7 Drawing Sheets

US 8,742,803 B2

OUTPUT DRIVER USING LOW VOLTAGE TRANSISTORS

TECHNICAL FIELD

The present description relates generally to output drivers, and more particularly, to output drivers using low voltage transistors.

BACKGROUND

An output driver may be used to drive a load with an output signal based on an input signal. The output driver may be implemented using integrated circuits including transistors. To properly drive the load (e.g., in accordance with an input/output (I/O) standard), the output driver may be required to have a minimum voltage swing at its output.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in block diagram form in order to avoid obscuring the concepts of the subject technology.

Figure 1:
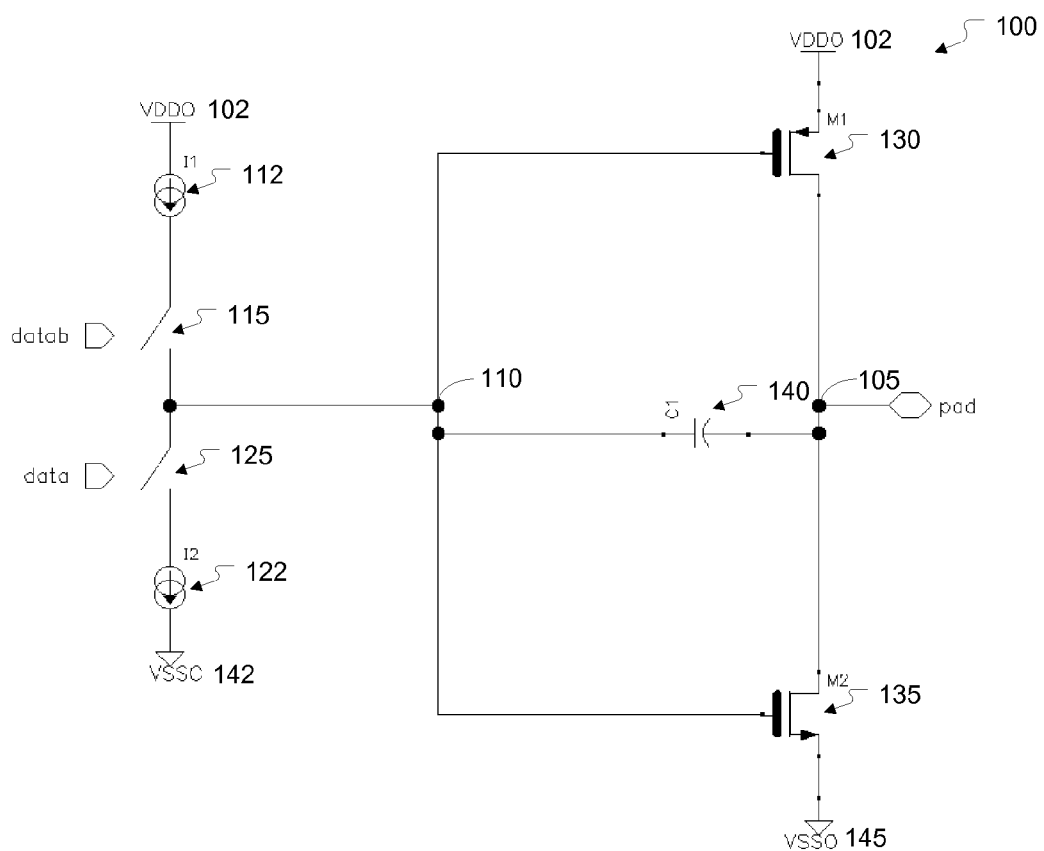
FIG. 1 illustrates an example of an output driver.

FIG. 1 shows an example of an output driver 100. The output driver 100 includes current sources I1 112 and I2 122, switches 115 and 125, and an output stage including a pair of complementary transistors. In the example shown in FIG. 1, the complementary transistors are a p-channel metal-oxide-semiconductor field-effect transistor (MOSFET) M1 130 and an n-channel MOSFET M2 135, in which the drains of MOSFETs M1 130 and M2 135 are coupled to an output 105 of the output driver 100, the source of MOSFET M1 130 is coupled to voltage bus VDDO 102, and the source of MOSFET M2 135 is coupled to voltage bus VSSO 145, which may be grounded. The current sources I1 112 and I2 122 are controllably coupled to the gates of MOSFETs M1 130 and M2 135 by switches 115 and 125, respectively.

The output driver 100 is configured to output a high voltage or a low voltage at the output 105 based on a data signal and a datab signal, which control switches 125 and 115, respectively. To provide precise control over the edge rate (rise time and fall time) at the output 105, a capacitor C1 140 may be coupled between the output 105 and the gates of MOSFETs M1 130 and M2 135, as shown in the example in FIG. 1.

The output 105 is driven high when the voltage of the data signal is high and the voltage of the datab signal is low. This is because switch 125 is closed when the data signal is high and switch 115 is open when the datab signal is low. This enables current source I2 122 to pull the input node 110 to approximately ground, thereby turning on MOSFET M1 130 and turning off MOSFET M2 135. As a result, MOSFET M1 130 pulls the output 105 up to approximately VDDO. In this case, the source-to-gate voltage of MOSFET M1 130 is approximately equal to VDDO.

The output 105 is driven low when the voltage of the data signal is low and the voltage of the datab signal is high. This is because switch 125 is open when the data signal is low and switch 115 is closed when the datab signal is high. This enables current source I1 112 to pull the input node 110 to approximately VDDO, thereby turning on MOSFET M2 135 and turning off MOSFET M1 130. As a result, MOSFET M2 135 pulls the output 105 down to approximately ground at voltage bus VSSO 145. In this case, the gate-to-source voltage of MOSFET M2 135 is approximately equal to VDDO.

Thus, the source-to-gate voltage of MOSFET M1 130 is approximately equal to VDDO when the output 105 is high and the gate-to-source voltage of MOSFET M2 135 is approximately equal to VDDO when the output 105 is low. However, as the dimensions of integrated circuits scale down with advances in semiconductor fabrication processing, the gate oxide thickness may also scale down, reducing the oxide-breakdown voltage of MOSFETs below VDDO. When the oxide-breakdown voltage is reduced below VDDO in a conventional circuit, the output driver 100 in FIG. 1 will lead to breakdown of MOSFETs M1 130 and M2 135, and cease to operate.

Accordingly, aspects of the subject technology provide output drivers that prevent breakdown of MOSFETs through the use of source followers. In some aspects, a source follower provides voltage-level shifting of a voltage at the input node 110 before the voltage is fed to the gate of a MOSFET. The voltage-level shifting prevents the source-to-gate voltage or the gate-to-source voltage of the MOSFET from exceeding the oxide-breakdown voltage of the MOSFET. This allows the output driver 100 to be implemented with transistors having an oxide-breakdown voltage below the output voltage swing of the output driver 100.

Figure 2:
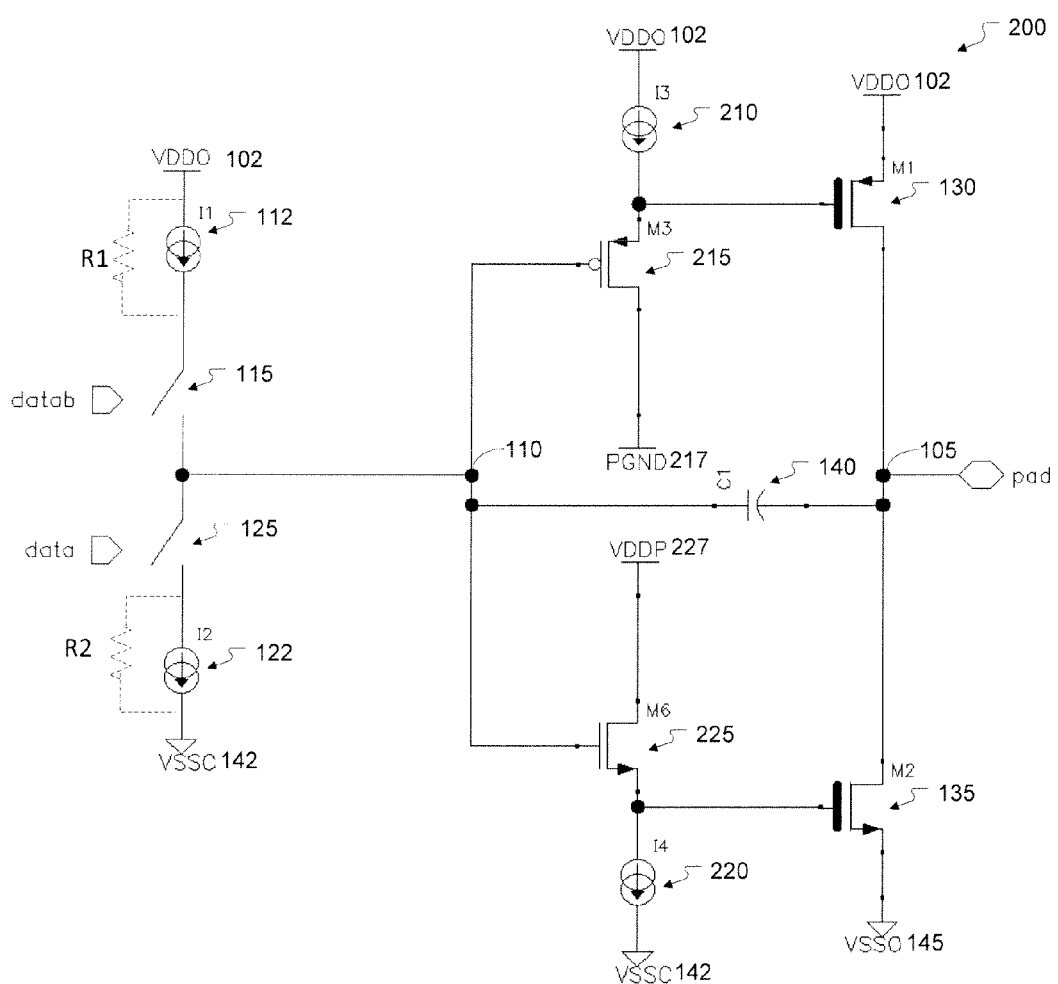
FIG. 2 illustrates an exemplary output driver including source followers according to aspects of the subject technology.

FIG. 2 shows an exemplary output driver 200 according to some aspects of the subject technology. The output driver 200 includes an n-channel MOSFET M6 225 coupled between the input node 110 and the gate of MOSFET M2 135 in a source-follower configuration. The source of MOSFET M6 225 is coupled to the gate of MOSFET M2 135, the drain of MOSFET M6 225 is coupled to voltage bus VDDP 227, and the gate of MOSFET M6 225 is coupled to the input node 110. The output driver 200 further includes a current source I4 220 coupled between the source of MOSFET M6 225 and a ground at voltage bus VSSC 142. The current source I4 220 is configured to pull down the gate voltage of MOSFET M2 135 to approximately ground when MOSFET M6 225 is turned off. VDDP is set to a voltage level at or below the oxide-breakdown voltage of MOSFET M2 135.

When the output driver 200 is driven low by switching on current source I1 112, the input node 110 is pulled to approximately VDDO. MOSFET M6 225 shifts the voltage at the input node 110 down to a lower voltage level before the voltage is fed to the gate of MOSFET M2 135. The downward voltage shift lowers the voltage seen at the gate of MOSFET M2 135, thereby lowering the gate-to-source voltage of MOSFET M2 135 and preventing breakdown of MOSFET M2 135. In the example in FIG. 2, the downward voltage shift is approximately equal to the gate-to-source voltage of MOSFET M6 225.

When the output 105 is low, both MOSFET M2 135 and MOSFET M6 225 operate in the triode region. The gate voltage of MOSFET M2 135 is approximately equal to VDDP minus a small drain-to-source voltage drop across MOSFET M6 225, which conducts current I4. Thus, the gate-to-source voltage of MOSFET M2 135 is constrained to a voltage slightly below VDDP, which, as discussed above, may be set to a voltage level at or below the oxide-breakdown voltage of MOSFET M2 135. This prevents the gate voltage of MOSFET M2 135 from exceeding the oxide-breakdown voltage of MOSFET M2 135. Also, VDDP may be set to a voltage at or below the drain-to-source breakdown voltage of MOSFET M6 225 to limit the drain-to-source voltage of MOSFET M6 225 to a value that does not exceed the drain-to-source breakdown voltage of MOSFET M6 225, thereby preventing breakdown of MOSFET M6 225.

The output driver 200 also includes a p-channel MOSFET M3 215 coupled between the input node 110 and the gate of MOSFET M1 130 in a source-follower configuration. The source of MOSFET M3 215 is coupled to the gate of MOSFET M1 130, the drain of MOSFET M3 215 is coupled to voltage bus PGND 217, and the gate of MOSFET M3 215 is coupled to the input node 110. The output driver 200 further includes a current source I3 210 coupled between the source of MOSFET M3 215 and voltage bus VDDO 102. The current source I3 210 is configured to pull up the gate voltage of MOSFET M1 130 to approximately VDDO when MOSFET M3 215 is turned off. In some implementations, PGND is equal to a voltage of VDDO minus VDDP. The difference between VDDO and PGND may be set to a voltage at or below either or both of the oxide-breakdown voltage of MOSFET M1 130 and the source-to-drain breakdown voltage of MOSFET M3 215.

When the output driver 200 is driven high by switching on current source I2 122, the input node 110 is pulled to approximately ground at bus VSSC 142. MOSFET M3 215 shifts the voltage at the input node 110 up to a higher level before the voltage is fed to the gate of MOSFET M1 130. As a result of the upward voltage shift, the source-to-gate voltage of MOSFET M1 130 is reduced, preventing breakdown of MOSFET M1 130. In the example in FIG. 2, the voltage shift is approximately equal to the source-to-gate voltage of MOSFET M3 215.

When the output 105 is high, both MOSFET M1 130 and MOSFET M3 215 operate in the triode region. The gate voltage of MOSFET M1 130 is approximately equal to PGND plus a small source-to-drain voltage drop across MOSFET M3 215, which conducts current I3. Thus, the source-to-gate voltage of MOSFET M1 130 is constrained to a voltage level slightly below the difference between VDDO and PGND, which is at or below the oxide-breakdown voltage of MOSFET M1 130. This prevents the source-to-gate voltage of MOSFET M1 130 from exceeding the oxide-breakdown voltage of MOSFET M1 130. Also, the difference between VDDO and PGND may be set to a voltage at or below the source-to-drain breakdown voltage of MOSFET M3 215 to limit the source-to-drain voltage of MOSFET M3 215 to a voltage at or below the source-to-drain breakdown voltage of MOSFET M3 215, thereby preventing breakdown of MOSFET M3 215.

In some implementations, either or both MOSFETs M1 130 and M2 135 may be a laterally diffused MOS (LDMOS) transistor. A LDMOS transistor typically has a higher drain-to-source breakdown voltage, gate-to-drain breakdown voltage and/or source-to-drain breakdown voltage than a non-LDMOS transistor. This enables the drains of MOSFETs M1 130 and M2 135 at the output 105 to swing between VDDO and VSSO without causing source-to-drain breakdown, gate-to-drain breakdown, and/or drain-to-source breakdown.

Either or both of MOSFETs M3 215 and M6 225 may be implemented using non-LDMOS transistors. In some implementations, VDDP limits the drain-to-source voltage of MOSFET M6 225 to a voltage at or below the drain-to-source breakdown voltage of MOSFET M6 225, and PGND limits the source-to-drain voltage of MOSFET M3 215 to a voltage at or below the source-to-drain breakdown voltage of MOSFET M3 215, as discussed above.

Thus, the output driver 200 can include source followers (e.g., MOSFETs M3 215 and M6 225) to provide voltage-level shifting that prevents the source-to-gate voltage of MOSFET M1 130 and the gate-to-source voltage of MOSFET M2 135 from exceeding the oxide-breakdown voltage. Further, the use of LDMOS transistors for MOSFETs M1 130 and M2 135 prevents the voltage swing at the output 105 of the driver 200 from exceeding the source-to-drain breakdown voltage of MOSFET M1 130 and the drain-to-source breakdown of MOSFET M2 135.

In some implementations, one or more of current sources I1, I2, I3 and I4 may be a current mirror. In some implementations, a resistor may be used instead of a current source. For example, a resistor (e.g., resistor R1) may be coupled between voltage bus VDDO 102 and the input node 110, in which the resistance of the resistor controls the amount of current used to pull up the input node 110 to VDDO. Similarly, a resistor (e.g., resistor R2) may be coupled between the input node 110 and voltage bus VSSC 142, in which the resistance of the resistor controls the amount of current used to pull down the input node 110 to VSSC. In some implementations, a resistor may be implemented using a MOSFET functioning as a resistor. For example, a p-channel MOSFET with a gate tied to ground may function as a resistor.

Voltages VDDP and PGND may be provided by a voltage regulator, a voltage divider or other type of voltage source.

Aspects of the subject technology may be used to prevent breakdown in various applications where it is desirable for the output voltage swing of an output driver to exceed the oxide-breakdown voltage of MOSFETs in the output driver. For example, the output driver may comply with an I/O standard requiring a minimum output voltage swing that exceeds the oxide-breakdown voltage of MOSFETs in the output driver. Thus, aspects of the subject technology allow the output voltage swing to comply with the I/O standard using transistors with a low oxide-breakdown voltage.

When the output 105 of the output driver 200 transitions between the low output state (e.g., approximately ground) and the high output state (e.g., approximately VDDO), MOSFETs M1 130 and M2 135 may be simultaneously turned on for a short period of time during the transition. For example, when the output 105 transitions from low to high, the input node 110 may transition from VDDO to ground. During this transition, the voltage at the input node 110 may pass through a voltage range between VDDO and ground, during which time both MOSFETs M1 130 and M2 135 are simultaneously turned on and conducting current. As a result, a relatively large current may flow between VDDO and ground through MOSFETs M1 130 and M2 135 during the transition. This current, which may be referred to as crow-bar current, may result in an undesirable large power dissipation across MOSFETs M1 130 and M2 135. The large power dissipation may cause either or both of overheating of the output driver 200 and a reduction in battery life when the output driver 200 is used in a portable electronic device.

Figure 3:
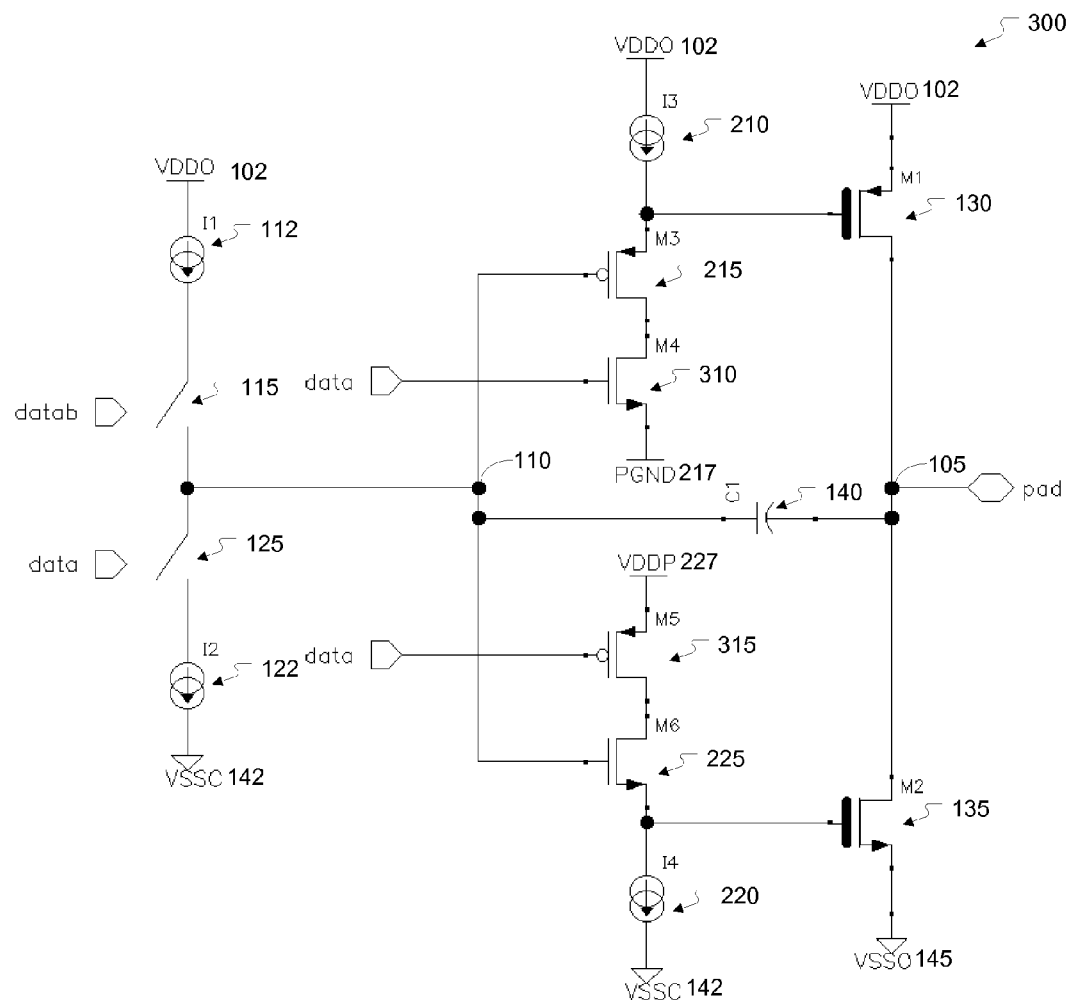
FIG. 3 illustrates an exemplary output driver including switching transistors that can be used for turning off output transistors according to aspects of the subject technology.

FIG. 3 shows an exemplary output driver 300 according to aspects of the subject technology for reducing the crow-bar current. The output driver 300 includes switching MOSFET M4 310 for more quickly turning off MOSFET M1 130 when the output 105 transitions from the high state to the low state, and switching MOSFET M5 315 for more quickly turning off MOSFET M2 135 when the output transitions from the low state to the high state.

MOSFET M4 310 is coupled between the drain of MOSFET M3 215 and bus PGND 217. In the example shown in FIG. 3, MOSFET M4 310 may be an n-channel MOSFET having a drain coupled to the drain of MOSFET M3 215, a source coupled to bus PGND 217, and a gate coupled to the data signal. In operation, when the output 105 is high, the data signal turns on MOSFET M4 310, coupling the drain of MOSFET M3 215 to bus PGND 217 through MOSFET M4 310. When the output 105 begins to transition from high to low, the data signal turns off MOSFET M4 310. As a result, the drain of MOSFET M3 215 is decoupled from bus PGND 217 and MOSFET M3 215 stops conducting current. This allows current source I3 210 to pull up the gate of MOSFET M1 130 to approximately VDDO, and therefore rapidly turn off MOSFET M1 130. The rapid turn off of MOSFET M1 130 reduces the time that both MOSFET M1 130 and M2 135 simultaneously conduct current, thereby reducing the crow-bar current.

In other words, when the output 105 of the output driver 300 begins to transition from high to low, MOSFET M4 310 is turned off (opened), which rapidly shuts off the current in source follower MOSFET M3 215. This enables current source I3 210 to rapidly pull up the gate of MOSFET M1 130 to approximately VDDO to turn off MOSFET M1 130.

MOSFET M5 315 is coupled between the bus VDDP 227 and the drain of MOSFET M6 225. In the example shown in FIG. 3, MOSFET M5 315 may be a p-channel MOSFET having a drain coupled to the drain of MOSFET M6 225, a source coupled to bus VDDP 227, and a gate coupled to the data signal. In operation, when the output 105 is low, the data signal turns on MOSFET M5 315, coupling the drain of MOSFET M6 225 to VDDP through MOSFET M5 315. When the output 105 begins to transition from low to high, the data signal turns off MOSFET M5 315. As a result, the drain of MOSFET M6 225 is decoupled from the bus VDDP 227 and MOSFET M6 225 stops conducting current. This enables current source I4 220 to rapidly pull down the gate of MOSFET M2 135 to approximately ground at bus VSSC 142, and therefore rapidly turn off MOSFET M2 135. The rapid turn off of MOSFET M2 135 reduces the time that both MOSFET M1 130 and M2 135 simultaneously conduct current, thereby reducing the crow-bar current.

In other words, when the output 105 of the output driver 300 begins to transition from low to high, MOSFET M5 315 is turned off (opened), which rapidly shuts off the current in source follower MOSFET M6 225. This enables current source I4 220 to rapidly pull down the gate of MOSFET M2 135 to approximately ground at bus VSSC 142 to turn off MOSFET M2 135.

Figure 4:
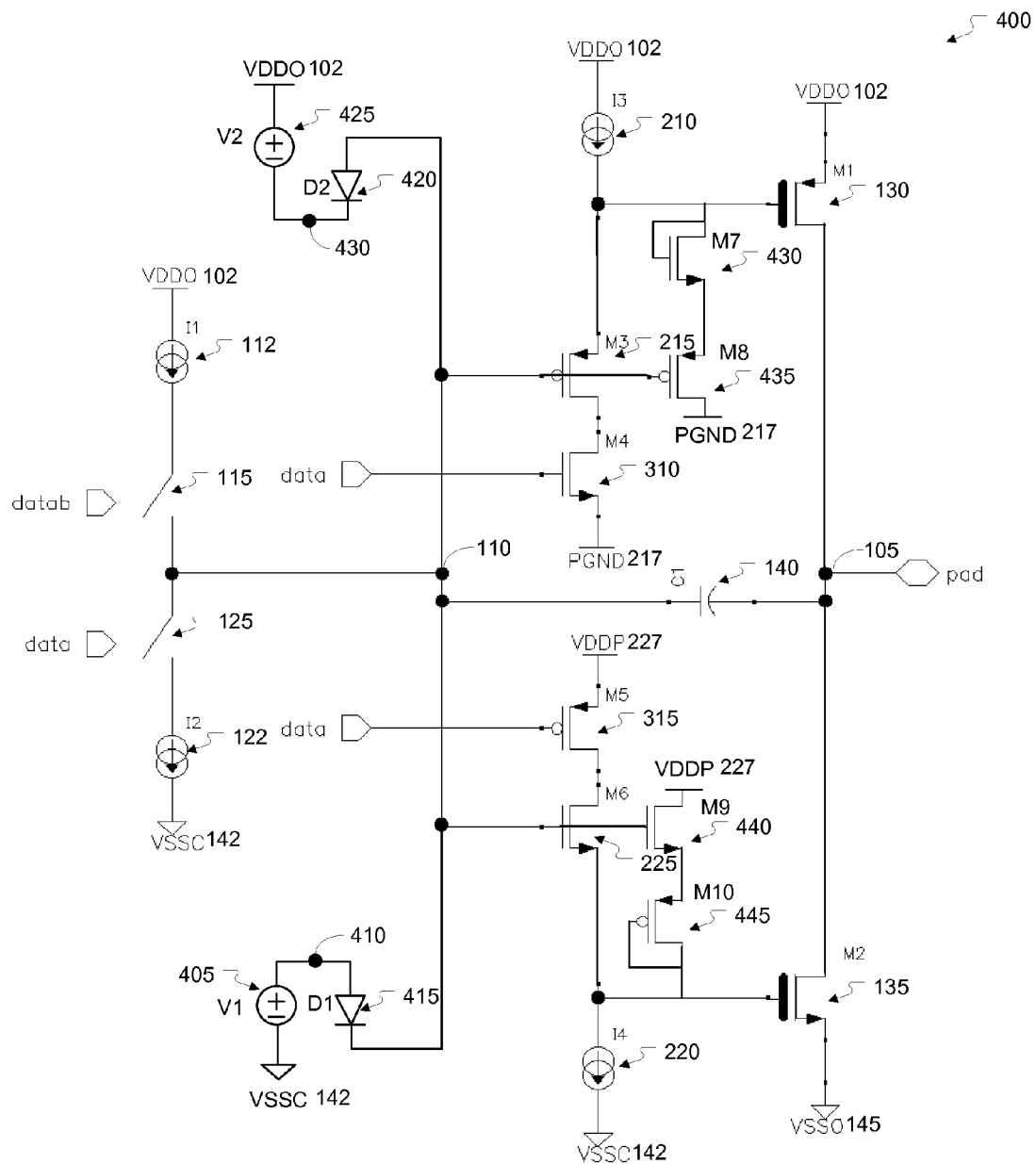
FIG. 4 illustrates an exemplary output driver that includes overvoltage protection circuitry according to aspects of the subject technology.

FIG. 4 shows an exemplary output driver 400 with overvoltage protection circuitry according to aspects of the subject technology. The output driver 400 includes voltage source V1 405 and diode D1 415 coupled between the input node 110 and ground at bus VSSC 142, and voltage source V2 425 and diode D2 420 coupled between the input node 110 and bus VDDO 102. The voltage sources V1 405 and V2 425 and diodes D1 415 and D2 420 are configured to constrain the voltage swing at the input node 110 to provide overvoltage protection.

Voltage source V1 405 produces a voltage V1 at node 410. The anode of diode D1 415 is coupled to node 410 and the cathode of diode D1 415 is coupled to the input node 110. As a result, diode D1 415 is forward biased when the input node 110 drops to a voltage equal to V1 minus the turn-on voltage of diode D1 415. This clamps the lower end of the voltage swing at the input node 110 to a low input voltage equal to V1 minus the turn-on voltage of diode D1 415, instead of ground. The low input voltage may be set higher than ground while still being low enough to turn on MOSFETs M1 130 and M3 215, and to turn off MOSFETs M6 225 and M2 135 when the output 105 is high. This may be accomplished by setting the low input voltage to a voltage below the sum of the threshold voltages of MOSFETs M6 225 and M2 135.

Increasing voltage V1 reduces the source-to-gate voltage of MOSFET M3 215 when the output 105 is high. This is because the gate of MOSFET M3 215 (which is coupled to the input node 110) is at the low input voltage set by voltage source V1 405 and diode D1 415, instead of being at ground. Because the low input voltage is higher than ground, the gate voltage of MOSFET M3 215 is higher, thereby reducing the source-to-gate voltage of MOSFET M3. This reduction in the source-to-gate voltage of MOSFET M3 215 provides a larger margin between the source-to-gate voltage of MOSFET M3 215 and the oxide-breakdown voltage of MOSFET M3 215. This allows the source-to-gate voltage of MOSFET M3 215 to tolerate a larger transient voltage increase (e.g., due to capacitive kick) without MOSFET M3 215 breaking down.

Voltage source V2 425 produces a voltage V2. This results in a voltage of VDDO minus V2 at node 430. The cathode of diode D2 420 is coupled to node 430 and the anode of diode D2 420 is coupled to the input node 110. As a result, diode D2 420 is forward biased when the input node 110 reaches a voltage equal to VDDO minus V2 plus the turn-on voltage of diode D2 420. This clamps the upper end of the voltage swing at the input node 110 to a high input voltage equal to VDDO minus V2 plus the turn-on voltage of diode D2 420, instead of approximately VDDO. The high voltage may be lower than VDDO while still high enough to turn on MOSFETs M2 135 and M6 225, and to turn off MOSFETs M3 215 and M1 130 when the output 105 is low.

Increasing voltage V2 reduces the gate-to-source voltage of MOSFET M6 225 when the output 105 is low. This is because the gate of MOSFET M6 225 (which is coupled to the input node 110) is at the high input voltage set by voltage source V2 425 and diode D2 420, instead of being at approximately VDDO. Since the high input voltage is lower than VDDO, the gate voltage of MOSFET M6 225 is lower, thereby reducing the gate-to-source voltage of MOSFET M6 225. This reduction in the gate-to-source voltage of MOSFET M6 225 provides a larger margin between the gate-to-source voltage of MOSFET M6 225 and the breakdown voltage of MOSFET M6 225. This allows the gate-to-source voltage of MOSFET M6 225 to tolerate a larger transient voltage increase (e.g., due to capacitive kick) without MOSFET M6 225 breaking down.

Either or both of diodes D1 415 and D2 420 may be implemented using a diode-connected MOSFET. In some implementations, a MOSFET clamp may be used to provide voltage clamping, in which the MOSFET clamp has a gate coupled to a voltage source, a source coupled to the node being clamped, and a drain coupled to a power supply.

When the output 105 of the output driver 400 transitions from high to low, MOSFET M4 310 is turned off to rapidly shut off the current in source follower MOSFET M3 215. As discussed above, this allows current source I3 210 to rapidly pull the gate of MOSFET M1 135 to VDDO and turn off MOSFET M1 135. However, this may also rapidly pull the source of MOSFET M3 215 to VDDO. This may cause the source voltage of MOSFET M3 215 to rise more rapidly than the voltage at the input node 110, which is coupled to the gate of MOSFET M3 215. Because of the difference in rise times between the source and the gate of MOSFET M3 215, the source-to-gate voltage of MOSFET M3 215 may exceed the oxide-breakdown voltage of MOSFET M3 215.

Accordingly, the output driver 400 may include a voltage clamp configured to clamp the source-to-gate voltage of MOSFET M3 215 to a voltage at or below the oxide-breakdown voltage of MOSFET M3 215. In some implementations, the clamp may include an n-channel MOSFET M7 430 and a p-channel MOSFET M8 435 coupled between the source and the gate of MOSFET M3 215. MOSFETs M7 430 and M8 435 can be arranged to clamp the source-to-gate voltage of MOSFET M3 215 to a voltage at or below the oxide-breakdown voltage of MOSFET M3 215 to prevent breakdown of MOSFET M3 215.

The gate of MOSFET M8 435 is coupled to the input node 110 and the gate of MOSFET M3 215, and the drain of MOSFET M8 435 is coupled to bus PGND 217. MOSFET M7 430 is diode connected, in which the drain and gate of MOSFET M7 430 are tied together. The drain and gate of diode-connected MOSFET M7 430 are coupled to the source of MOSFET M3 215 and the source of diode-connected MOSFET M7 430 is coupled to the source of MOSFET M8 430.

When the output 105 is high, diode-connected MOSFET M7 430 is turned off, and therefore current does not flow through MOSFETs M7 430 and M8 435. This is because the voltage difference between the source of MOSFET M3 215 and PGND is below the threshold voltage of MOSFET M7 430, and thus too small to turn on diode-connected MOSFET M7 430.

When the output 105 of the output driver 400 begins to transition from high to low, MOSFET M4 310 is turned off and the source of MOSFET M3 215 (which is coupled to the gate of MOSFET M1 130) is pulled up toward VDDO by current source I3 210. If the voltage at the input node 110 rises more slowly, then the source-to-gate voltage of MOSFET M3 215 may momentarily increase. When the source-to-gate voltage of MOSFET M3 215 reaches a voltage sufficient to turn on both MOSFETs M7 430 and M8 435 (e.g., sum of the threshold voltages of MOSFETs M7 430 and M8 435), both MOSFETs M7 430 and M8 435 turn on. When this occurs, current begins to flow through MOSFETs M7 430 and M8 435. As a result, current from current source I3 210 is shunted through MOSFETs M7 430 and M8 435, thereby clamping the source-to-gate voltage of MOSFET M3 215. This prevents further increases in the source-to-gate voltage of MOSFET M3 215, and therefore, prevents the source-to-gate voltage of MOSFET M3 215 from exceeding the oxide-breakdown voltage of MOSFET M3 215.

The subject technology is not limited to a diode-connected n-channel MOSFET, e.g., MOSFET 7 430. For example, another type of diode may be used, in which the diode functions to clamp the source-to-gate voltage of MOSFET M3 215 by turning on, and thus shutting current through the diode, when the turn-on voltage of the diode is reached. In some implementations, a MOSFET clamp may be used to provide voltage clamping, in which the MOSFET clamp has a gate coupled to a voltage source, a source coupled to the node being clamped, and a drain coupled to a power supply.

The output driver 400 may also include a voltage clamp configured to clamp the gate-to-source voltage of MOSFET M6 225 to a voltage at or below the oxide-breakdown voltage of MOSFET M6 225. In some implementations, the clamp may include an n-channel MOSFET M9 440 and a p-channel MOSFET M10 445 coupled between the source and the gate of MOSFET M6 225. MOSFETs M9 440 and M10 445 can be arranged to clamp the gate-to-source voltage of MOSFET M6 225 to a voltage at or below the oxide-breakdown voltage of MOSFET M6 225.

The gate of MOSFET M9 440 is coupled to the input node 110 and the gate of MOSFET M6 225, and the drain of MOSFET M9 440 is coupled to bus VDDP 227. MOSFET M10 445 is diode connected, in which the drain and gate of MOSFET M10 445 are tied together. The drain and gate of diode-connected MOSFET M10 445 are coupled to the source of MOSFET M6 225 and the source of diode-connected MOSFET M10 445 is coupled to the source of MOSFET M9 440.

When the output 105 is low, diode-connected MOSFET M10 445 is turned off, and therefore current does not flow through MOSFETs M9 440 and M10 445. This is because the voltage difference between VDDP and the source of MOSFET M6 225 is below the threshold of MOSFET 10 445, and thus too small to turn on diode-connected MOSFET M10 445.

When the output driver 400 begins to transition from low to high, MOSFET M5 315 is turned off and the source of MOSFET M6 225 (which is coupled to the gate of MOSFET M2 135) is pulled down toward ground by current source I4 220. If the voltage at the input node 110 falls more slowly than the source voltage of MOSFET M6 225, then the gate-to-source voltage of MOSFET M6 225 may momentarily increase. When the gate-to-source voltage of MOSFET M6 225 reaches a voltage sufficient to turn on both MOSFETs M9 440 and M10 445 (e.g., sum of threshold voltages of MOSFETs M9 440 and M10 445), both MOSFETs M9 440 and M10 445 turn on. When this occurs, current begins to flow through MOSFETs M9 440 and M10 445. As a result, current flowing into current source I4 220 is shunted through MOSFETs M9 440 and M10 445, thereby clamping the gate-to-source voltage of MOSFET M6 225. This prevents further increases in the gate-to-source voltage of MOSFET M6, and therefore, prevents the gate-to-source voltage of MOSFET M6 225 from exceeding the oxide-breakdown voltage of MOSFET M6 225.

The subject technology is not limited to a diode-connected p-channel MOSFET, e.g., MOSFET 10 445. For example, another type of diode may be used, in which the diode functions to clamp the gate-to-source voltage of MOSFET M6 225 by turning on, and thus shutting current through the diode, when the turn-on voltage of the diode is reached. In some implementations, a MOSFET clamp may be used to provide voltage clamping, in which the MOSFET clamp has a gate coupled to a voltage source, a source coupled to the node being clamped, and a drain coupled to a power supply.

Aspects of the subject technology will now be described using the example of the universal serial bus (USB) 1.1 standard; however, it should be appreciated that the subject technology is not limited to this example, and may be applied to other I/O standards, such as the I squared C (I2C) standard. The USB 1.1 standard provides a communications protocol for communication between devices. An output driver complying with the USB 1.1 may have an output voltage swing of approximately 3.3 V.

Aspects of the subject technology allow an output driver, e.g., the output driver 200, 300 or 400, to comply with the USB 1.1 standard (e.g., output voltage swing of 3.3 V) using MOSFETs that have an oxide-breakdown voltage below 3.3 V. For example, the output driver 200, 300 or 400 may be implemented with MOSFETs fabricated using a 28 nm fabrication process, in which the MOSFETs have an oxide-breakdown voltage of approximately 1.8 V. For this example, VDDO may be approximately 3.3 V, VDDP may be approximately 1.8 V, and PGND may be approximately 1.5 V. The voltages for VDDP and PGND may be provided by a voltage regulator that converts 3.3 V from voltage bus VDDO 102 to 1.8 V and 1.5 V, respectively.

In this example, when the output 105 is low, the gate-to-source voltage of MOSFET M2 135 is approximately 1.8 V and the gate-to-source voltage of MOSFET M6 225 is approximately 1.5V, assuming a small drain-to-source voltage drop across MOSFET M6 225 when MOSFET M6 225 is turned on and operating in the triode region. The voltage at the output 105 is approximately at ground.

When the output 105 is high, the source-to-gate voltage of MOSFET M1 130 is approximately 1.8 V and the source-to-gate voltage of MOSFET M3 215 is approximately 1.5 V, assuming a small source-to-drain voltage across MOSFET M3 215 when MOSFET M3 215 is turned on and operating in the triode region. The voltage at the output 105 is approximately 3.3 V.

The output driver 200, 300 or 400 can realize an output voltage swing of 3.3 V without breaking down MOSFETs M1 130 and M2 135 by using LDMOS transistors for MOSFETs M1 130 and M2 135. MOSFET M3 215 provides voltage-level shifting that prevents the source-to-gate voltage of MOSFET M1 130 from exceeding the oxide-breakdown of MOSFET M1 130, and MOSFET M6 225 provides voltage-level shifting that prevents the gate-to-source voltage of MOSFET M2 135 from exceeding the oxide-breakdown of MOSFET M2 135. MOSFET M6 225 may be implemented using a non-LDMOS transistor since VDDP limits the drain-to-source voltage of MOSFET M6 225 to a voltage at or below the drain-to-source breakdown voltage of MOSFET M6 225. Similarly, MOSFET M3 215 may be implemented using a non-LDMOS transistor since PGND limits the source-to-drain voltage of MOSFET M3 215 to a voltage at or below the source-to-drain breakdown voltage of MOSFET M3 215.

Thus, the output driver 200, 300 or 400 is able to output a voltage swing of 3.3 V in compliance with the USB 1.1 standard using MOSFETs M1, M2, M3 and M6 with an oxide-breakdown voltage below 3.3 V (e.g., approximately 1.8 V).

To provide precise edge rate control at the output 105, a capacitor C1 140 may be coupled between the output 105 and the input node 110, as shown in the examples in FIGS. 2-4. The capacitor C1 140 provides capacitive feedback between the output node 105 and the input node 110 that increases the rise time and fall time at the output 105 by a controllable amount based on the capacitance of capacitor C1 140 and/or the current values of current sources I1 and I2.

For the example of the USB 1.1 standard, the capacitance of capacitor C1 140 and/or current values of current sources I1 112 and I2 122 may be set such that the rise time and fall time at the output 105 comply with the USB 1.1 standard. The USB 1.1 standard supports two data rates: a low data rate at approximately 1.5 Mbits/s and a full data rate of approximately 12 Mbits/s. For the low data rate, the USB 1.1 standard specifies rise/fall times between 75 ns and 300 ns. This is because a fast edge rate can create high frequency signals that can degrade the desired output signal (e.g., due to radiation emissions, reflections in the output signal line, etc. caused by the high frequency signals). For the full data rate, the USB 1.1 standard specifies rise/fall times between 4 ns and 20 ns. In this example, the capacitance of capacitor C1 140 may be 500 fF, and the current values of current sources I1 112 and I2 122 may be in the range of micro amps. For example, the current sources I1 112 and I2 122 may have a current of about 10 µA for the low data rate, and a current of about 150 µA for the full data rate. A typical capacitive load of between 50 pF and 600 pF may be coupled to the output 105, and may be taken into account when determining current values for current sources I1 112 and I2 122 that achieve desired rise/fall times.

In one aspect, the output driver 200, 300 or 400 may have adjustable rise/fall times at the output 105 for different modes of operation. For the example of the USB 1.1 standard, the output driver 200 may switch between operation at the low data rate and operation at the high data rate. For the low data rate, the output driver 200 may have rise/fall times between 75 ns and 300 ns at the output 105, and for the full data rate, the output driver 200 may have rise/fall times between 4 ns and 20 ns at the output 105.

Figure 5A:
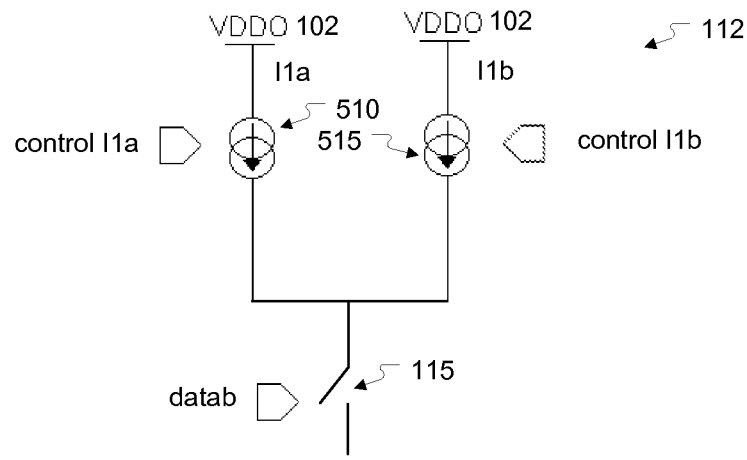
FIGS. 5A and 5B illustrate exemplary current sources with adjustable currents according to aspects of the subject technology.

In one aspect, the fall time at the output 105 may be adjusted between the two modes by adjusting the current value of current source I1 112. For example, current value of current source I1 112 may be made adjustable by implementing current source I1 112 with a first current source I1a 510 and a second current source I1b 515, as shown in FIG. 5A. In this example, the first current source I1a 510 may have a current value corresponding to a fall time between 75 ns and 300 ns, and the second current source I1b 515 may have a current value corresponding to a fall time between 4 ns and 20 ns. When the output driver operates at the low data rate, control signal I1a may activate the first current source I1a 510 and control signal I1b may deactivate the second current source I1b 515. Conversely, when the output driver operates at the full data rate, control signal I1b may activate the second current source I1b 515 and control signal I1a may deactivate the first current source I1a 510.

Figure 5B:
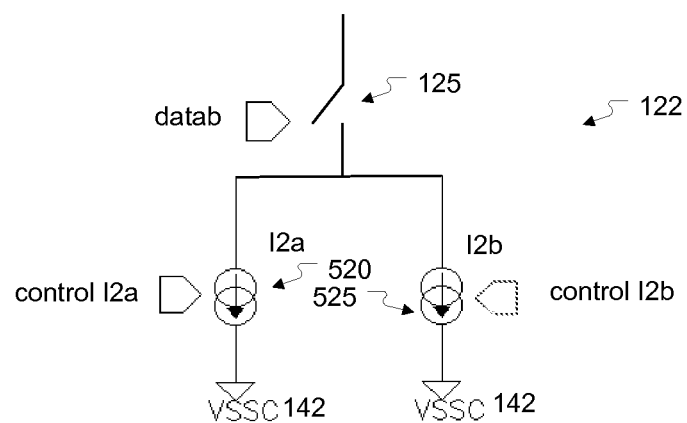

The rise time at the output 105 may be made adjustable by adjusting the current value of current source I2 122. For example, current source I2 122 may be made adjustable by implementing current source I2 122 with a third current source I2a 520 and a fourth current source I2b 525, as shown in FIG. 5B. In this example, the third current source I2a 520 may have a current value corresponding to a rise time between 75 ns and 300 ns, and the fourth current source I2b 525 may have a current value corresponding to a rise time between 4 ns and 20 ns. When the output driver operates at the low data rate, control signal I2a may activate the third current source I2a 520 and control signal I2b may deactivate the fourth current source I2b 525. Conversely, when the output driver operates in the full data rate, control signal I2b may activate the fourth current source I2b 525 and control signal I2a may deactivate the third current source I2a 520.

In some aspects, two of the output drivers 200, 300 or 400 may be used to drive a differential signal on two signal lines, in which each output driver drives one of the signal lines. For example, the USB 1.1 standard specifies a differential output signal on two signal lines. When one of the signal lines is driven high, the other signal line is driven low, and vice versa. In this example, two output drivers, e.g., any of the output drivers 200, 300 or 400, may be used to drive a differential output signal on two signal lines in compliance with the USB 1.1 standard. Each of the output drivers may be implemented using the output driver shown in any one of FIGS. 2-6. The output drivers may be driven by a differential input signal that drives the output drivers to different output states (i.e., when one of the output drivers is driven low, the other output driver is driven high, and vice versa).

In one aspect, two or more output drivers may be coupled to a load (e.g., a signal line), in which one of the output drivers drives a signal to the load at a time. For example, one of the output drivers may be activated to drive the load while the other output driver is tri-stated. The output of the tri-stated output driver may be floating so that the active output driver can drive the load. The output drivers may support different I/O standards, allowing a device with two or more output drivers to switch between the different I/O standards by selectively activating the corresponding output driver and tri-stating the other output driver.

Figure 6:
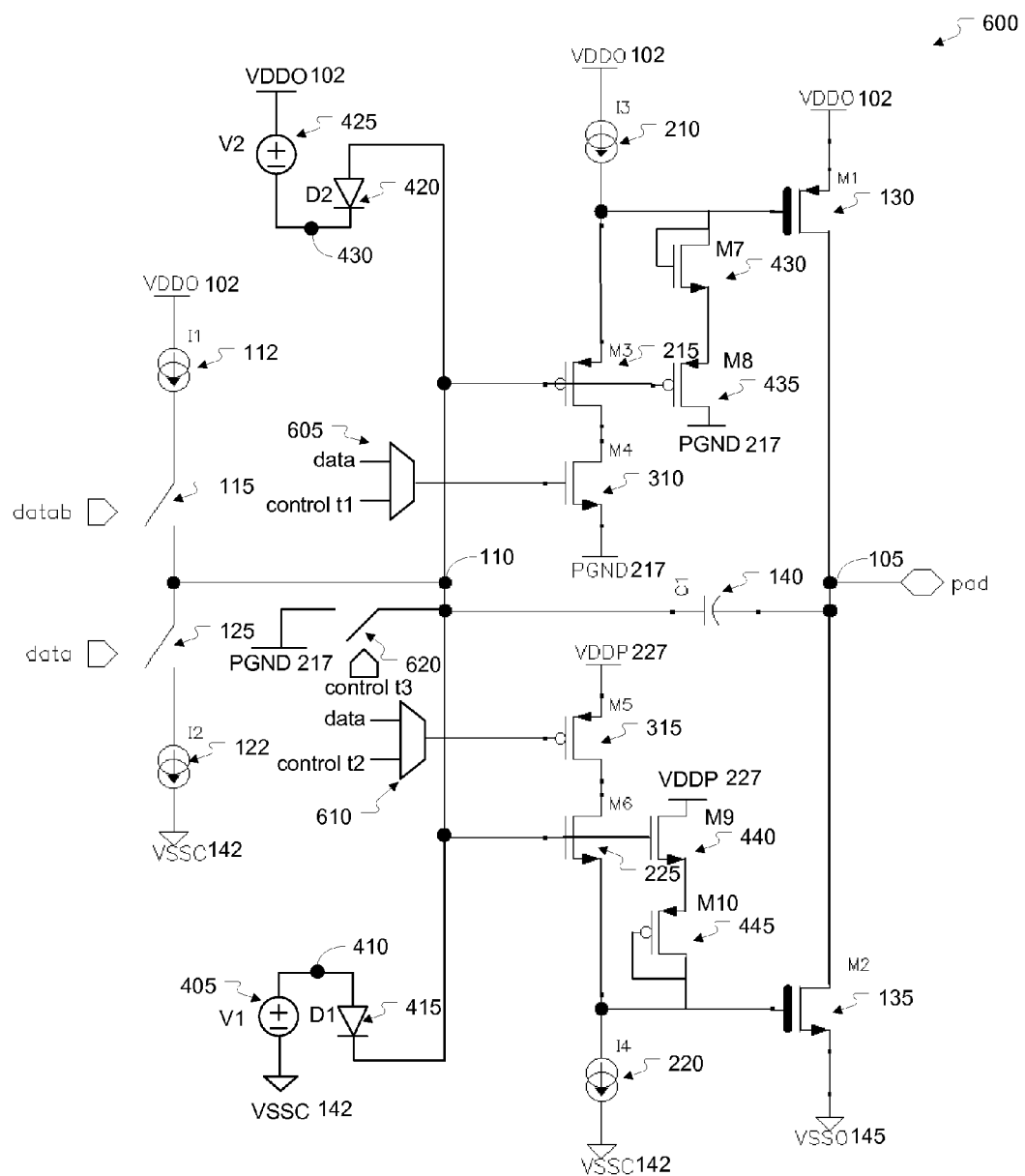
FIG. 6 illustrates an exemplary output driver capable of being tri-stated according to aspects of the subject technology.

FIG. 6 shows an example of an output driver 600 that is capable of being tri-stated according to aspects of the subject technology. The data signal may be input to the gates of MOSFETs M4 310 and M5 315 when the output driver 600 is active to reduce crow-bar current, as discussed above. Control signals t1 and t2 may be input to the gates of MOSFETs M4 310 and M5 315, respectively, when the output driver 600 is to be tri-stated. Control signals t1 and t2 turn off both MOSFETs M4 310 and M5 315. This causes the gate of MOSFET M1 130 to be pulled to approximately VDDO by current source I3 210, and the gate of MOSFET M2 135 to be pulled down to ground by current source I4 220. As a result, both MOSFETs M1 130 and M2 135 are turned off, leaving the output 105 floating. This allows another output driver coupled to the same load to drive the load. The output driver 600 may include multiplexer 605 for selectively inputting the data signal or control signal t1 to the gate of MOSFET M4 310 depending on whether the output driver 600 is in active operation or tri-stated, and multiplexer 610 for selectively inputting the data signal or control signal t2 to the gate of MOSFET M5 315 depending on whether the output driver 600 is in active operation or tri-stated.

The output driver 600 may also include a switch 620 for selectively coupling the input node 110 to bus PGND 217. When the output driver 600 is active, control signal t3 opens the switch 620 so that the input node 110 is decoupled from bus PGND 217 and allowed to swing. When the output driver 600 is to be tri-stated, control signal t3 closes the switch 620, thereby shorting the input node 110 to bus PGND 217. As a result, the gate-to-source voltage of MOSFET M6 225 is constrained to PGND, and the source-to-gate voltage of MOSFET M3 215 is constrained to the difference between VDDO and PGND. This prevents breakdown of MOSFETs M6 225 and M3 215 when the output driver 600 is tri-stated. Alternatively, the switch 620 may selectively couple the input node 110 to bus VDDP 227 or other voltage at or near the midpoint between VDDO and ground.

Figure 7:
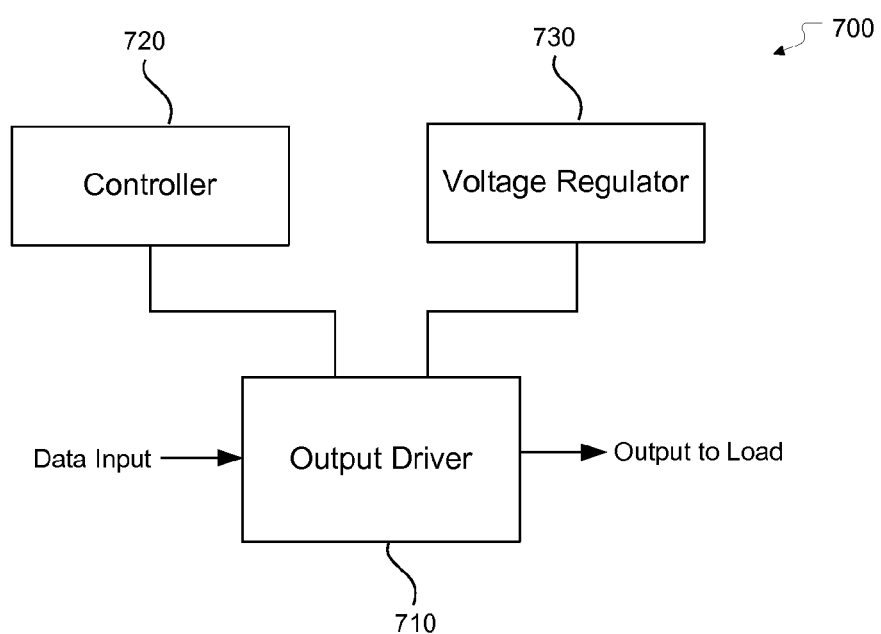
FIG. 7 illustrates an exemplary system including an output driver, a controller and a voltage regulator according to aspects of the subject technology.

FIG. 7 shows an exemplary system 700 including an output driver 710, a controller 720 and a voltage regulator 730. The output driver 710 may be implemented using any one of the output drivers described with respect to FIGS. 2-4 and 6. The output driver 710 is configured to drive a load (e.g., a USB cable coupled to a USB device) based on an input signal. In some implementations, the output driver 710, the controller 720 and the voltage regulator 730 may be integrated on a single chip.

The controller 720 is configured to control the operation of the output driver 710. The controller 720 may be implemented using integrated circuits, such as application specific integrated circuits (ASICs), one or more micro processors, field programmable gate arrays (FPGAs), hard-wired logic, and/or any combination thereof. Such integrated circuits may execute instructions that are stored in the circuits themselves, stored in an on-chip memory, and/or stored in an off-chip machine-readable storage medium.

In one aspect, the output driver 710 may support two or more different modes of operation, and the controller 720 may control in which of the modes the output driver 710 operates. Using the example of the USB 1.1 standard, the output driver 710 may support a low data rate mode of operation and a full data rate mode of operation with different edge rates. When the output driver 710 is to be operated at the low data rate, the controller 720 may reduce the edge rate for low data rate operation by activating current sources I1a 510 and I2a 520 and deactivating current sources I1b 515 and I2b 525 shown in FIGS. 5A and 5B. When the output driver 710 is to be operated at the full data rate, the controller 720 may increase the edge rate for high data rate operation by activating current sources I1b 515 and I2b 525 and deactivating current sources I1a 510 and I2a 520. The controller 710 can detect the speed of the device coupled to the output driver 710, and control the mode of operation of the output driver 710 accordingly.

The controller 720 may also tri-state the output driver 710 when the output driver 710 is idle and/or another output driver is driving the load. In this aspect, the controller 720 may tri-state the output driver 710 by turning off (opening) both MOSFETs M4 310 and M5 315. As discussed above, this turns off both output MOSFETs M1 130 and M2 135, which floats the output 105 of the output driver 710. The controller 720 may also close switch 620 to tie the input node 110 to PGND.

The voltage regulator 730 is configured to provide voltages used by the output driver 710. For example, the voltage regulator 730 may convert VDDO to PGND and VDDP for use by the output driver 710. The voltage regulator 730 may be implemented using a voltage divider or other circuitry capable of converting VDDO to other voltages.

In the disclosure, two elements that are "coupled" together may be directly coupled to each other with no intervening elements or may be indirectly coupled to each other with one or more intervening elements.

In some implementations, the output stage of the output driver 200 may include additional transistors. For example, the output stage may be a cascade output stage including a common-gate n-channel MOSFET coupled between the drain of MOSFET M2 135 and the output 105, and a common-gate p-channel MOSFET coupled between the drain of MOSFET M1 130 and the output 105.

In some implementations, the output stage may include a resistor coupled between the drain of MOSFET M2 135 and the output 105, and another resistor coupled between the drain of MOSFET M1 130 and the output 105. The resistors may be used, for example, to provide output impedance matching.

While the transistors in the above described figures are shown as metal oxide semiconductor field effect transistors (MOSFETs), one of ordinary skill in the art will appreciate that the transistors may be implemented using any type of transistor including, but not limited to, bipolar junction transistors, and other types of field effect transistors (FETs), such as junction FETs (JFETs). For bipolar implementations, one or more bipolar junction transistors connected in an emitter-follower configuration may be used to provide voltage-level shifting between the input node 110 and the output stage.

The previous description is provided to enable a person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. An output driver, comprising:
a first p-channel transistor having a drain, a source, and a gate, wherein the source of the first p-channel transistor is coupled to a first voltage bus;
a first n-channel transistor having a drain, a source, and a gate, wherein the drains of the first p-channel transistor and the first n-channel transistor are coupled to an output of the output driver, and the source of the first n-channel transistor is coupled to a second voltage bus;
a second p-channel transistor coupled between an input and the gate of the first p-channel transistor in a source-follower configuration; and
a second n-channel transistor coupled between the input and the gate of the first n-channel transistor in a source-follower configuration, wherein the drain of the second n-channel transistor is coupled to a third voltage bus, and wherein the first voltage bus is different from the third voltage bus, and wherein the first and the third voltage buses are configured such that the output driver is enabled to provide an output voltage that exceeds breakdown voltages of the first p-channel transistor and the first n-channel transistor.

2. The output driver of claim 1, wherein each of the first p-channel transistor and the first n-channel transistor comprises a Laterally Diffused Metal Oxide Semiconductor (LDMOS) transistor.

3. The output driver of claim 2, wherein each of the second p-channel transistor and the second n-channel transistor comprises a non-LDMOS transistor.

4. The output driver of claim 1, further comprising a capacitor coupled between the output and gates of the second p-channel transistor and the second n-channel transistor.

5. The output driver of claim 1, wherein a source of the second n-channel transistor is coupled to the gate of the first n-channel transistor, a gate of the second n-channel transistor is coupled to the input.

6. The output driver of claim 5, further comprising a current source coupled to the gate of the first n-channel transistor, wherein the current source is configured to pull down a gate voltage of the first n-channel transistor to turn off the first n-channel transistor when the second n-channel transistor is turned off.

7. The output driver of claim 6, further comprising a switching transistor coupled between the third voltage bus and the drain of the second n-channel transistor, wherein the switching transistor is closed when the output of the output driver is driven to a low state and open when the output of the output driver is driven to a high state.

8. The output driver of claim 5, further comprising a voltage clamp coupled between the gate and the source of the second n-channel transistor, wherein the voltage clamp is configured to clamp a gate-to-source voltage of the second n-channel transistor to a voltage at or below a breakdown voltage of the second n-channel transistor.

9. The output driver of claim 5, further comprising a resistor coupled between the gate of the second n-channel transistor and a fourth voltage bus.

10. The output driver of claim 9, wherein the fourth voltage bus is approximately at a ground.

11. An output driver, comprising:
a p-channel transistor having a drain, a source, and a gate, wherein the source of the p-channel transistor is coupled to a first voltage bus;
an n-channel transistor having a drain, a source, and a gate, wherein the drains of the p-channel transistor and the n-channel transistor are coupled to an output of the output driver, and the source of the n-channel transistor is coupled to a second voltage bus;
a first source follower coupled between an input and the gate of the p-channel transistor, wherein the first source follower is configured to shift a voltage at the input upward before the voltage is fed to the gate of the p-channel transistor; and a second follower coupled between the input and the gate of the n-channel transistor, wherein the second source follower is configured to shift the voltage at the input downward before the voltage is fed to the gate of the n-channel transistor, wherein the second follower is coupled to a third voltage bus, and wherein the first voltage bus is different from the third voltage bus, and wherein the first and the third voltage buses are configured such that the output driver is enabled to provide an output voltage that exceeds breakdown voltages of the first p-channel transistor and the first n-channel transistor.

12. The output driver of claim 11, wherein, when the voltage at the input exceeds a breakdown voltage of the n-channel transistor, the second source follower shifts the voltage at the input to a lower voltage at or below the breakdown voltage of the n-channel transistor.

13. The output driver of claim 11, further comprising:
a first current source coupled to the gate of the p-channel transistor, wherein the first current source is configured to pull up a gate voltage of the p-channel transistor to turn off the p-channel transistor when the first source follower is turned off; and
a second current source coupled to the gate of the n-channel transistor, wherein the second current source is configured to pull down a gate voltage of the n-channel transistor to turn off the n-channel transistor when the second source follower is turned off.

14. The output driver of claim 13, further comprising:
a first switching transistor configured to shut off current in the first source follower when the output of the output driver is driven to a low state; and
a second switching transistor configured to shut off current in the second source follower when the output driver is driven to a high state.

15. The output driver of claim 11, further comprising a capacitor coupled between the output and the input of the output driver to provide capacitive feedback.

16. The output driver of claim 15, further comprising:
a first switchable current source coupled to the input; and
a second switchable current source coupled to the input, wherein one of the first and second switchable current sources is switched on at a time based on an input signal.

17. The output driver of claim 11, further comprising a voltage clamp coupled between the input and the gate of the n-channel transistor.

18. A system, comprising:
an output driver including:
a p-channel transistor having a drain, a source, and a gate, wherein the source of the p-channel transistor is coupled to a first voltage bus;
an n-channel transistor having a drain, a source, and a gate, wherein the drains of the p-channel transistor and the n-channel transistor are coupled to an output of the output driver, and the source of the n-channel transistor is coupled to a second voltage bus;
a first source follower coupled to a third voltage bus and coupled between an input of the output driver and the gate of the p-channel transistor, wherein the first source follower is configured to shift a voltage at the input upward before the voltage is fed to the gate of the p-channel transistor; and
a second follower coupled to a fourth voltage bus and coupled between the input and the gate of the n-channel transistor, wherein the second source follower is configured to shift the voltage at the input downward before the voltage is fed to the gate of the n-channel transistor, wherein the first voltage bus is different from the fourth voltage bus, and wherein the first and the forth voltage buses are configured such that the output driver is enabled to provide an output voltage that exceeds breakdown voltages of the first p-channel transistor and the first n-channel transistor.

19. The system of claim 18, wherein the output driver further comprises:
a first switching transistor coupled between the third voltage bus and the first source follower; and
a second switching transistor coupled between the fourth voltage bus and the second source follower.

20. The system of claim 19, further comprising a controller configured to tri-state the output driver by opening both the first and second switching transistors.

21. The system of claim 18, wherein the output driver further comprises a capacitor coupled between the output and the input of the output driver to provide capacitive feedback.

22. The system of claim 21, wherein the output driver further comprises:
a voltage regulator configured to provide a first voltage to the third voltage bus and a second voltage to the fourth voltage bus, wherein a difference between a voltage at the first voltage bus and the first voltage is at or below a breakdown voltage of the p-channel transistor and the second voltage is at or below a breakdown voltage of the n-channel transistor;
a first switchable current source coupled to the input; and
a second switchable current source coupled to the input, wherein one of the first and second switchable current sources is switched on at a time based on an input signal.

23. The system of claim 22, wherein the first switchable current source has a first adjustable current and the second switching current source has a second adjustable current, and the system further comprises a controller configured to adjust the first and second adjustable currents based on a mode of operation of the output driver.

* * * * *